US008444848B2

(12) United States Patent
Yue et al.

(10) Patent No.: US 8,444,848 B2
(45) Date of Patent: May 21, 2013

(54) ELECTROCHEMICAL SUBSTRATE SLICING USING ELECTROMAGNETIC WAVE EXCITATION

(75) Inventors: Hongyu H. Yue, Plano, TX (US); Junjun Liu, Austin, TX (US); Dorel I. Toma, Dripping Springs, TX (US)

(73) Assignee: Tokyo Electron Limited, Tokyo (JP)

( * ) Notice: Subject to any disclaimer, the term of this patent is extended or adjusted under 35 U.S.C. 154(b) by 491 days.

(21) Appl. No.: 12/697,985

(22) Filed: Feb. 1, 2010

(65) Prior Publication Data

US 2011/0186443 A1 Aug. 4, 2011

(51) Int. Cl.
*B23H 7/02* (2006.01)
*B23H 7/38* (2006.01)

(52) U.S. Cl.
USPC .......................................... 205/655; 204/242

(58) Field of Classification Search
USPC ......................................... 205/655, 686, 654
See application file for complete search history.

(56) References Cited

U.S. PATENT DOCUMENTS 4,113,587 A * 9/1978 Chikamori .................... 205/651
4,283,259 A * 8/1981 Melcher et al. ............... 205/646
4,369,099 A * 1/1983 Kohl et al. .................... 205/646
4,725,706 A * 2/1988 Inoue ......................... 219/69.12
4,847,463 A * 7/1989 Levy et al. ................. 219/69.12
5,338,416 A * 8/1994 Mlcak et al. .................. 205/643
6,319,370 B1 * 11/2001 Sun et al. ................. 204/224 M
6,423,207 B1 * 7/2002 Heidari et al. ................ 205/655
7,250,104 B2 * 7/2007 Uzoh et al. .................... 205/655

OTHER PUBLICATIONS

Lin, C. W.; Fan, F-R. F.; Bard, A. J. High Resolution Photoelectrochemical Etching of n-GaAs with Scanning Electrochemical and Tunneling Microscope. Journal of the Electrochemical Society, 1987, p. 1038-1039.*

Definition: ultraviolet light. 1996, Academic Press Dictionary of Science and Technology.*

Definition: visible light. 2001 Dictionary of Astronomy; Peter Collin Publishing.*

* cited by examiner

*Primary Examiner* — Nicholas A Smith
*Assistant Examiner* — Brian W Cohen
(74) *Attorney, Agent, or Firm* — Wood, Herron & Evans, LLP

(57) ABSTRACT

An apparatus for cutting a workpiece using electrochemical etching and a method of using thereof are described. The apparatus includes an electrochemical bath configured to contain an electrochemical solution, a support apparatus configured to support and immerse a workpiece in the electrochemical bath, and a non-contact cutting device configured to extend into the electrochemical bath and slice the workpiece via electrochemical etching along a cutting plane. The apparatus further includes an electromagnetic (EM) radiation source configured to illuminate a cutting surface formed between opposing sidewalls within an evolving cutting groove formed in the workpiece during slicing along the cutting plane.

19 Claims, 6 Drawing Sheets

200
210
240
212
214
-
230
216
218
225
+

ELECTROCHEMICAL SUBSTRATE SLICING USING ELECTROMAGNETIC WAVE EXCITATION

BACKGROUND OF THE INVENTION

1. Field of Invention

The invention relates to a method and apparatus for performing electrochemical substrate slicing. More particularly, the invention relates to a method and apparatus for performing electrochemical substrate slicing using electrochemical etching with electromagnetic (EM) wave excitation to affect etch anisotropy.

2. Description of Related Art

Silicon wafer cost accounts more than 50% for crystalline silicon wafer based PV (photovoltaic) cell production. The conventional method includes slicing a silicon ingot into wafers using a mechanical technique, such as a wire saw or (inner diameter) circular saw. However, the current state-of-art wire saw technique results in excess of about 180 micron of kerf loss. Electrochemical etching of silicon has been studied and generally understood.

SUMMARY OF THE INVENTION

The invention relates to a method and apparatus for performing electrochemical substrate slicing. More particularly, the invention relates to a method and apparatus for performing electrochemical substrate slicing using electrochemical etching with electromagnetic (EM) wave excitation to affect etch anisotropy. The method and apparatus may reduce kerf loss.

According to one embodiment, an apparatus for cutting a workpiece using electrochemical etching is described. The apparatus includes an electrochemical bath configured to contain an electrochemical solution, a support apparatus configured to support and immerse a workpiece in the electrochemical bath, and a non-contact cutting device configured to extend into the electrochemical bath and slice the workpiece via electrochemical etching along a cutting plane. The apparatus further includes an electromagnetic (EM) radiation source configured to illuminate a cutting surface formed between opposing sidewalls within an evolving cutting groove formed in the workpiece during slicing along the cutting plane.

According to another embodiment, a method of electrochemical slicing is described. The method comprises: disposing a workpiece in an electrochemical bath; illuminating a cutting surface on the workpiece with electromagnetic (EM) radiation; extending a cutting device into the electrochemical bath, the cutting device comprising a cutting electrode; applying a voltage between the cutting electrode and the workpiece; and slicing the workpiece by translating the cutting electrode adjacent the cutting surface without contacting the cutting surface.

DETAILED DESCRIPTION OF SEVERAL EMBODIMENTS

An apparatus and method for cutting and/or slicing a workpiece is disclosed in various embodiments. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" or variation thereof means that a particular feature, structure, material, or characteristic described in connection with the embodiment is included in at least one embodiment of the invention, but do not denote that they are present in every embodiment. Thus, the appearances of the phrases such as "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Nonetheless, it should be appreciated that, contained within the description are features which, notwithstanding the inventive nature of the general concepts being explained, are also of an inventive nature.

Figure 1:
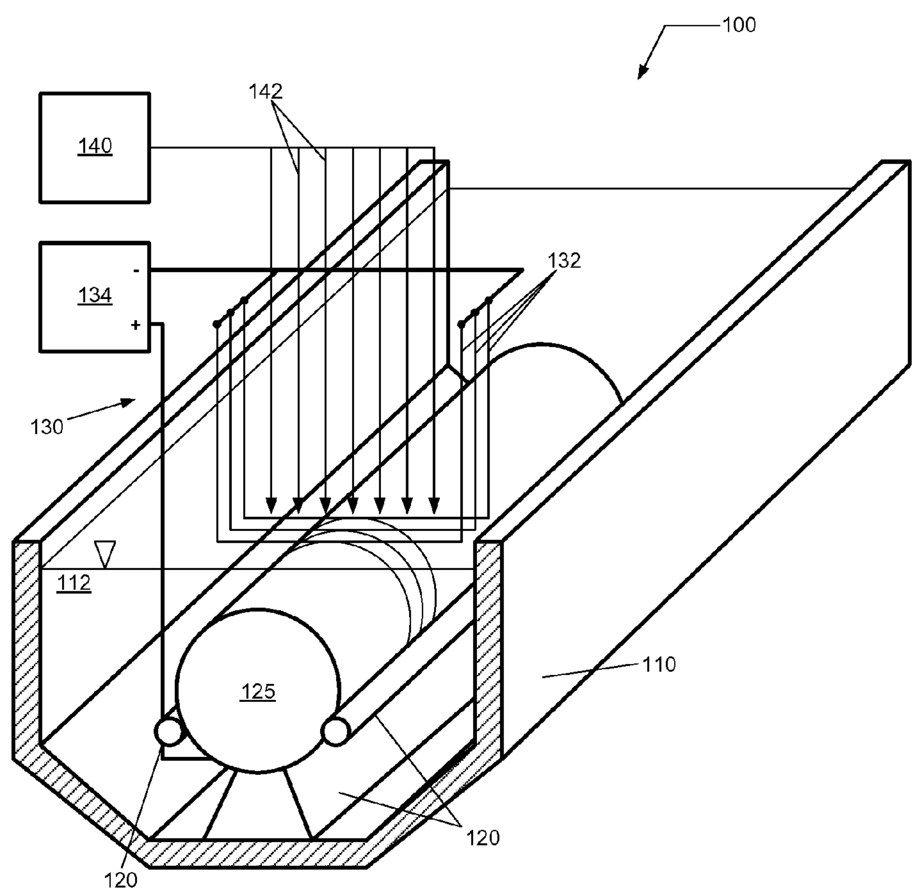
FIG. 1 provides a schematic illustration of an electrochemical slicing apparatus according to an embodiment.

Referring now to the drawings, wherein like reference numerals designate identical or corresponding parts throughout the several views, FIG. 1 provides a schematic illustration of an electrochemical slicing apparatus 100 according to an embodiment. The electrochemical slicing apparatus 100 includes an electrochemical bath 110 configured to contain an electrochemical solution 112, a support apparatus 120 configured to support and immerse a workpiece 125 in the electrochemical bath 110, and a non-contact cutting device 130 configured to extend into the electrochemical bath 110 and slice (or cut, or groove or score) the workpiece 125 via electrochemical etching along a cutting plane. The workpiece 125 may comprise a silicon ingot. For example, the workpiece 125 may comprise un-doped silicon, doped silicon, mono-crystalline silicon, poly-crystalline silicon, amorphous silicon, etc.

The electrochemical solution 112 may comprises an aqueous HF solution. The concentration of HF (hydrogen fluoride) in DI (de-ionized) water may range from about 1% wt to about 10% wt. Alternatively, the concentration of HF in DI water may range from about 3% wt to about 6% wt. Alternatively, the electrochemical solution 112 may comprise an aqueous KOH (potassium hydroxide) solution. Alternatively yet, the electrochemical solution 112 may comprise an organic electrolyte, such as DMSO (dimethyl sulfoxide).

The temperature of the electrochemical solution 112 may range up to about 100 degrees C. Alternatively, the temperature of the electrochemical solution 112 may range from about 30 degrees C. to about 100 degrees C. Alternatively, the temperature of the electrochemical solution 112 may range from about 50 degrees C. to about 100 degrees C. Alternatively, the temperature of the electrochemical solution 112 may be about 80 degrees C.

The non-contact cutting device 130 comprises a cutting electrode 132 (or plurality of cutting electrodes, as illustrated in FIG. 1), and an electrical power source 134 coupled to the cutting electrode 132 and the workpiece 125 and configured to apply a voltage between the cutting electrode 132 and the workpiece 125. For example, the electrical power source may comprise a DC (direct current) voltage source. The voltage may range up to about 50 V (volts). Alternatively, the voltage may range up to about 30 V (volts). Alternatively, the voltage may range up to about 20 V (volts). Alternatively, the voltage may range up to about 10 V (volts).

The cutting electrode 132 may include a conductive wire or conductive ribbon. For example, the cutting electrode 132 may comprise gold, platinum, tungsten, or any combination of two or more elements thereof.

The electrochemical slicing apparatus 100 further includes an electromagnetic (EM) radiation source 140 configured to illuminate a cutting surface formed between opposing sidewalls within an evolving cutting groove formed in the workpiece 125 with EM radiation 142 during slicing along the cutting plane. The EM radiation source 140 may comprise a source of ultraviolet (UV) light, visible (VIS) light, or infrared (IR) light, or any combination of two or more thereof. The EM radiation source 140 may comprise one or more UV/VIS/IR lamps, one or more UV/VIS/IR LEDs (light-emitting diodes), or one or more UV/VIS/IR lasers, or a combination of two or more thereof.

For example, the EM radiation source 140 may provide EM radiation having a wavelength ranging from about 200 nm (nanometers) to about 700 nm. Additionally, for example, the EM radiation source 140 may provide EM radiation having a wavelength ranging from about 200 nm to about 400 nm.

Furthermore, for example, the EM radiation may contain a first wavelength or first range of wavelengths, and a second wavelength or second range of wavelengths. The second wavelength or second range of wavelengths may be different from the first wavelength or first range of wavelengths, or there may be some overlap. EM radiation containing the first wavelength or first range of wavelengths may be provided by the EM radiation source 160, while EM radiation containing the second wavelength or second range of wavelengths may be provided by another EM radiation source. Alternatively, the first wavelength or first range of wavelengths and the second wavelength or second range of wavelengths may be provided by the EM radiation source 160.

For instance, the power requirements for UV radiation assisted electrochemical etching of a 20 micron cutting surface may be estimated as follows:

$$P(\mathrm{W/cm^2}) \sim (400v)/(\eta\lambda), \quad (4)$$

wherein $\eta$ represents the UV absorption efficiency (%), $\lambda$ represents the UV wavelength (nm), and $v$ represents the desired cutting rate (μm/sec, microns per second). For 300 nm UV radiation, an absorption efficiency of 30%, and a practical cutting rate, the power density requirement may be as great as 40 W/cm$^2$.

Figure 2:
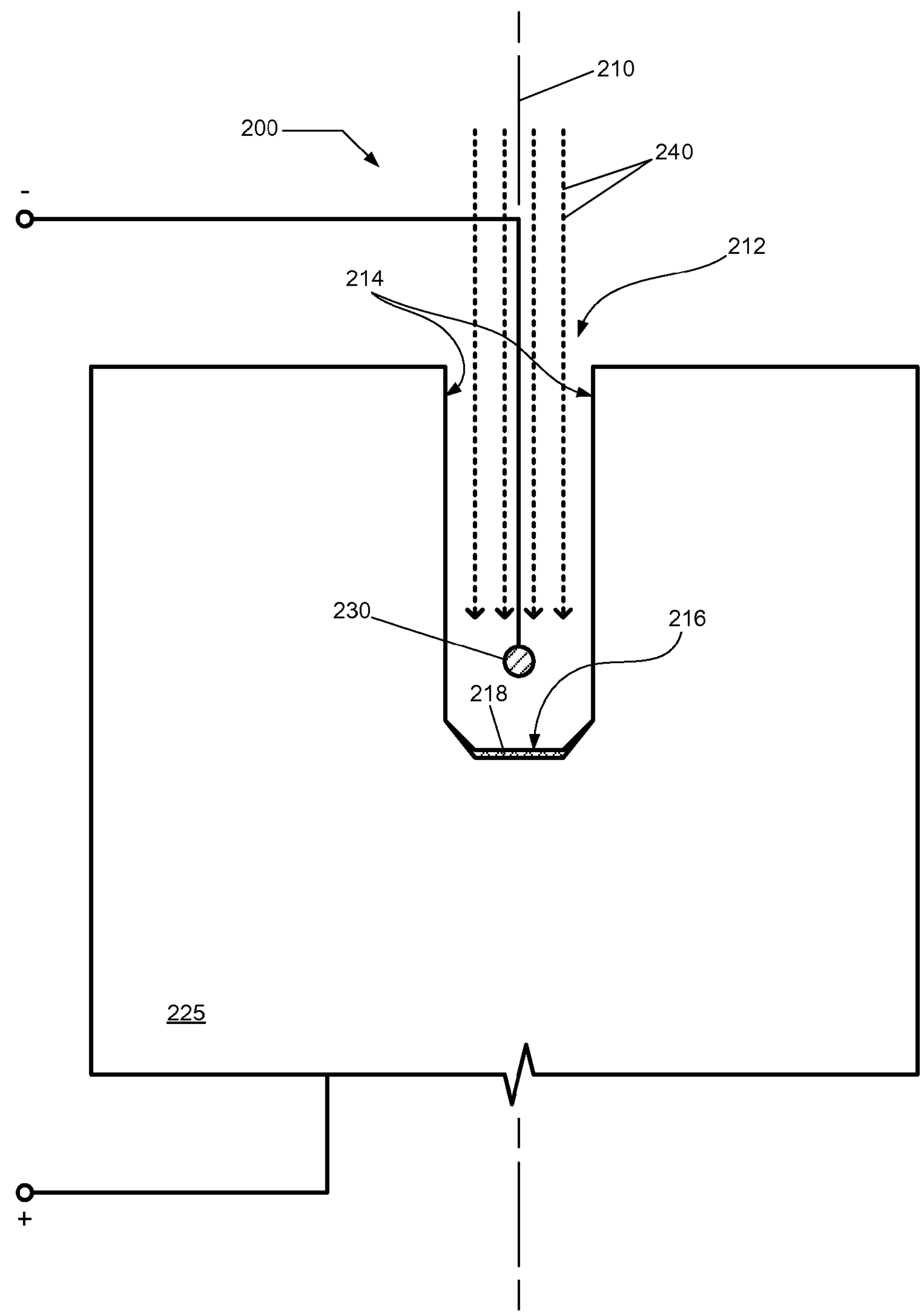
FIG. 2 provides a schematic illustration of an electrochemical slicing method according to another embodiment.

Referring now to FIG. 2, a schematic illustration of an electrochemical slicing method is provided according to another embodiment. An exploded, cross-sectional view 200 of a workpiece 225 is shown, wherein a cutting groove 212 is formed during electrochemical etching of a cutting surface 216 disposed between opposing sidewalls 214. A cutting device, including cutting electrode 230, extends into the cutting groove 212 along cutting plane 210 while not contacting the workpiece 225. A voltage is applied between the cutting electrode 230 and the workpiece 225, such that the cutting electrode 230 is biased negative.

During the formation and evolution of cutting groove 212, the cutting surface 216 is illuminated with EM radiation 240 to affect greater electrochemical etch anisotropy. The inventors believe that illumination of the cutting surface 216 with EM radiation along cutting plane 210 augments the production of electron-hole pairs in surface layer region 218. The increased concentration of holes accelerates the oxidation reaction. For lightly doped $p^+$ and $n^+$ silicon, this effect becomes more pronounced.

As an example, the electrochemical etching of a silicon surface in an aqueous HF solution may be characterized by an oxidation process wherein the silicon surface is oxidized, followed by a dissolution process wherein the oxidized silicon surface is dissolved in the aqueous HF solution, viz.

Anode Reaction:

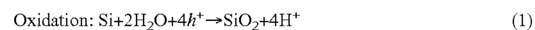

$$\text{Oxidation: } Si+2H_2O+4h^+ \rightarrow SiO_2+4H^+ \quad (1)$$

$$\text{Dissolution: } SiO_2+2HF+2HF \rightarrow SiF_4^{2-}+2H_2O \quad (2)$$

Cathode Reaction:

$$4H^++4e^- \rightarrow 2H_2 \quad (3)$$

Inspection of the chemical reactions above reveals that increased hole production ($h^+$) leads to a greater oxidation rate for silicon; see reaction (1).

TABLE 1

| | Dark | EM radiation |
|---|---|---|
| Current (mA/cm) | 100 | 100 |
| Voltage (V) | 15 | 10 |
| Time (min) | 20 | 10 |
| Kerf loss (μm) | 100 | 70 |
| Speed (μm/min) | 60 | 80 |

As a matter of comparison, Table 1 provides exemplary data for electrochemical etching of silicon without EM radiation exposure ("Dark") and with EM radiation exposure ("EM radiation"). The EM radiation includes exposure of a 15 cm by 15 cm region of the workpiece with a 500 W UV lamp. The current (mA/cm, milli-Amps per centimeter) between the anode and cathode, the voltage (V) applied across the anode and cathode, and the etch time (min, minutes) are provided. Further, the kerf loss (μm) and the cutting speed (μm/min) are provided. With EM radiation, the cutting speed is increase by at least 30%, while the kerf loss is reduced by at least 30% and the energy usage is reduced by at least 60%.

Figure 3A:
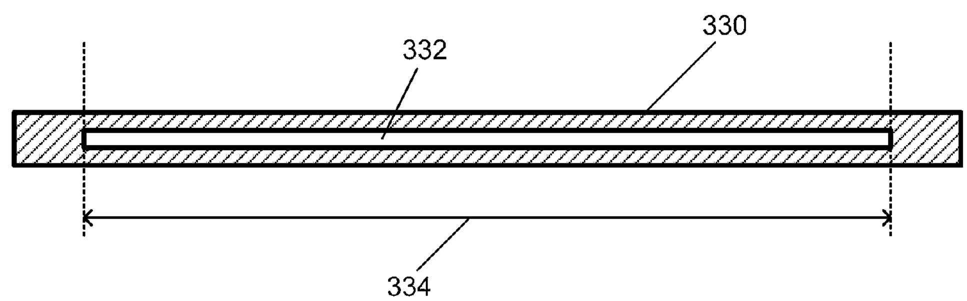
FIGS. 3A through 3C depict a non-contact cutting device according to several embodiments.
Figure 3B:
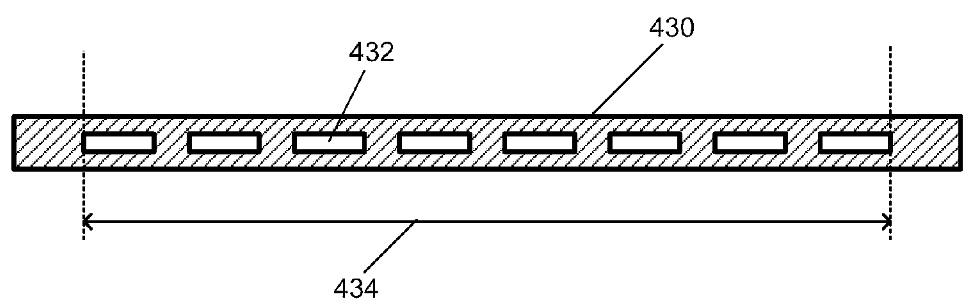
Figure 3C:
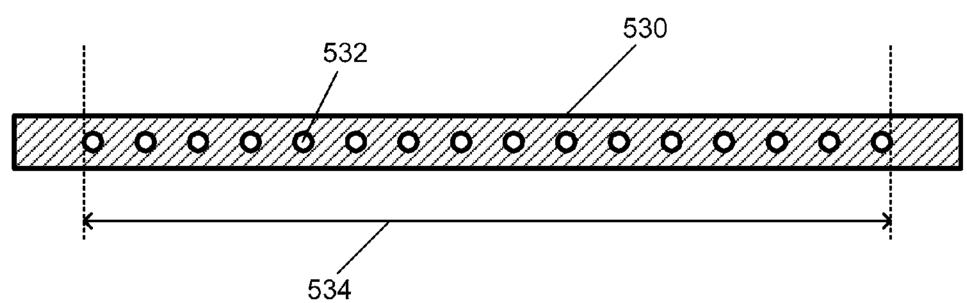

As shown in FIGS. 3A through 3C, cutting electrodes (330, 430, 530) may comprise one or more openings (332, 432, 532) formed there through to allow greater exposure of the cutting surface to the EM radiation source. For example, as shown in FIG. 3A, opening 332 may span the full cutting width 334 of cutting electrode 330. However, opening 332 need not span the full cutting width 334. Additionally, for example, as shown in FIG. 3B, a plurality of elongated openings 432 may be distributed the full cutting width 434 of cutting electrode 430. However, the plurality of elongated openings 432 need not span the full cutting width 434. Additionally yet, for example, as shown in FIG. 3C, a plurality of circular openings 532 may be distributed the full cutting width 534 of cutting electrode 530. However, the plurality of circular openings 532 need not span the full cutting width 534. Additional embodiments may include various shapes for the openings, such as square, rectangular, circular, elliptical, etc., and various distributions thereof. For example, the one or more openings may be non-uniformly distributed along the span of the cutting width.

Figure 4A:
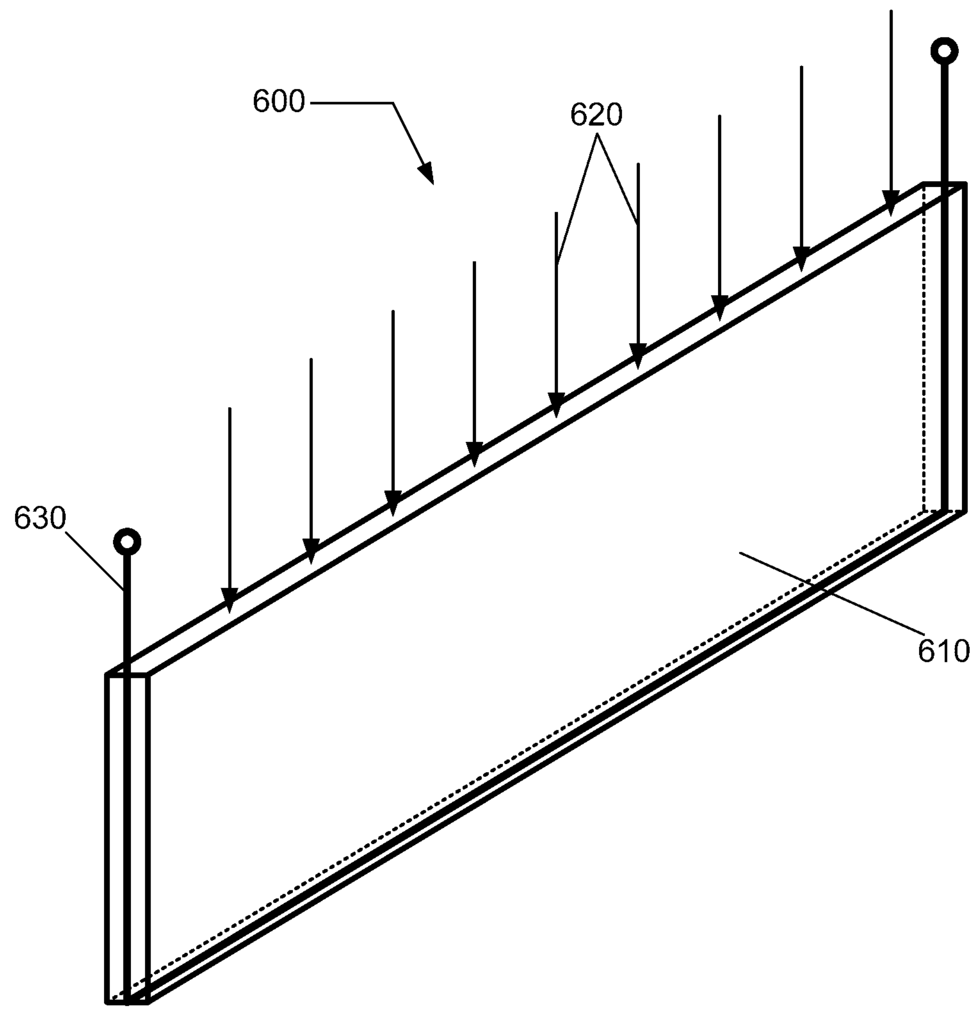
FIGS. 4A and 4B depict a non-contact cutting device according to additional embodiments.

As shown in FIG. 4A, a non-contact cutting device 600 is described according to another embodiment. The non-contact cutting device 600 comprises a cutting electrode 630 and may further comprise an optical waveguide 610 configured to direct and/or collimate EM radiation 620 from the EM radiation source towards the cutting surface relative to the sidewalls in order to preferentially etch the cutting surface rather than the sidewalls. The optical waveguide 610 may comprise a plurality of optical fibers, or an optical sheet, or a combination thereof. For example, the optical waveguide 610 may include a sheet of sapphire. As shown in FIG. 4A, the cutting electrode 630 extends along a bottom edge of the optical waveguide 610. Furthermore, as shown in FIG. 4A, the cutting electrode 630 may be embedded within the bottom edge of the optical waveguide 610.

Figure 4B:
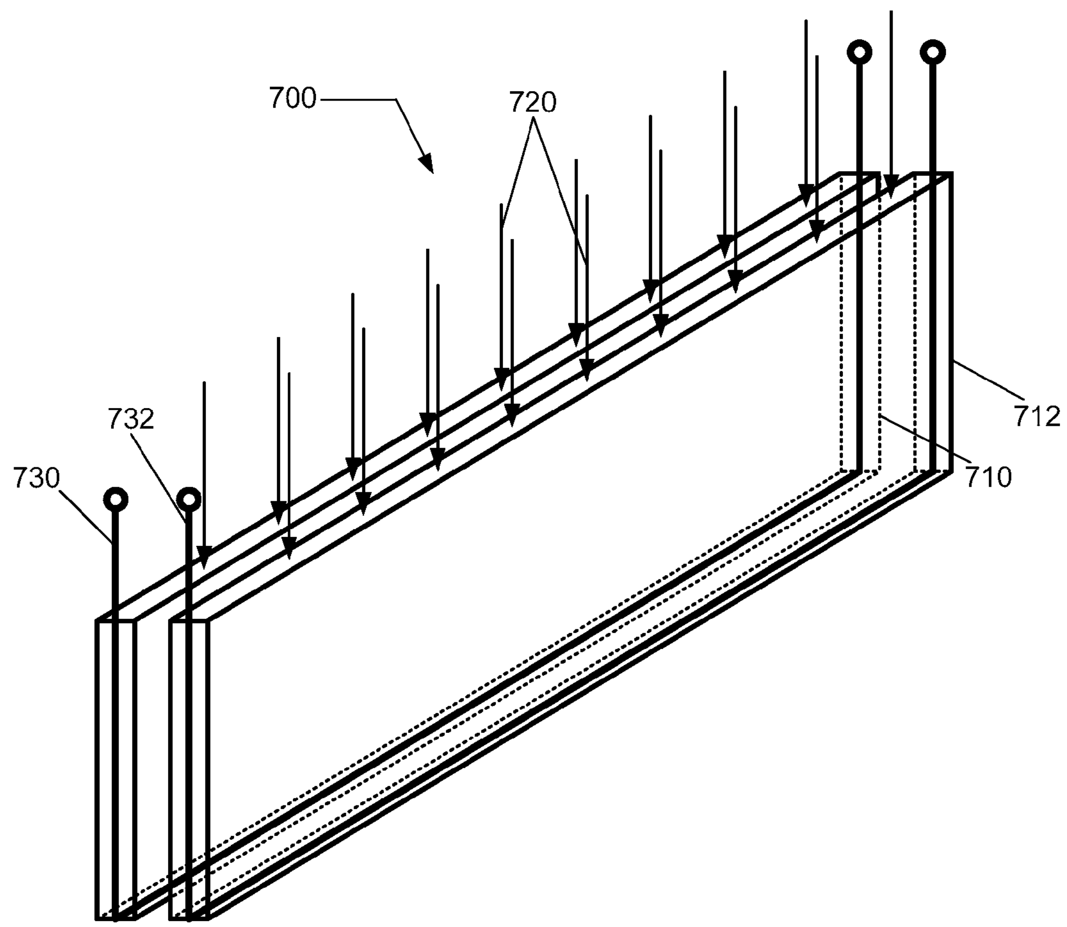

As shown in FIG. 4B, a non-contact cutting device 700 is described according to yet another embodiment. The non-contact cutting device 700 comprises a plurality of cutting electrodes (730, 732), and may further comprise optical waveguides (710, 712) configured to direct and/or collimate EM radiation 720 from the EM radiation source towards the respective cutting surfaces relative to the associated sidewalls in order to preferentially etch the cutting surfaces rather than the sidewalls. The optical waveguides (710, 712) may comprise a plurality of optical fibers, or an optical sheet, or a combination thereof. For example, the optical waveguides (710, 712) may include a sheet of sapphire. As shown in FIG. 4B, the cutting electrodes (730, 732) extend along a bottom edge of the optical waveguides (710, 712), respectively. Furthermore, as shown in FIG. 4B, the cutting electrodes (730, 732) may be embedded within the bottom edge of the optical waveguides (710, 712), respectively.

Figure 5:
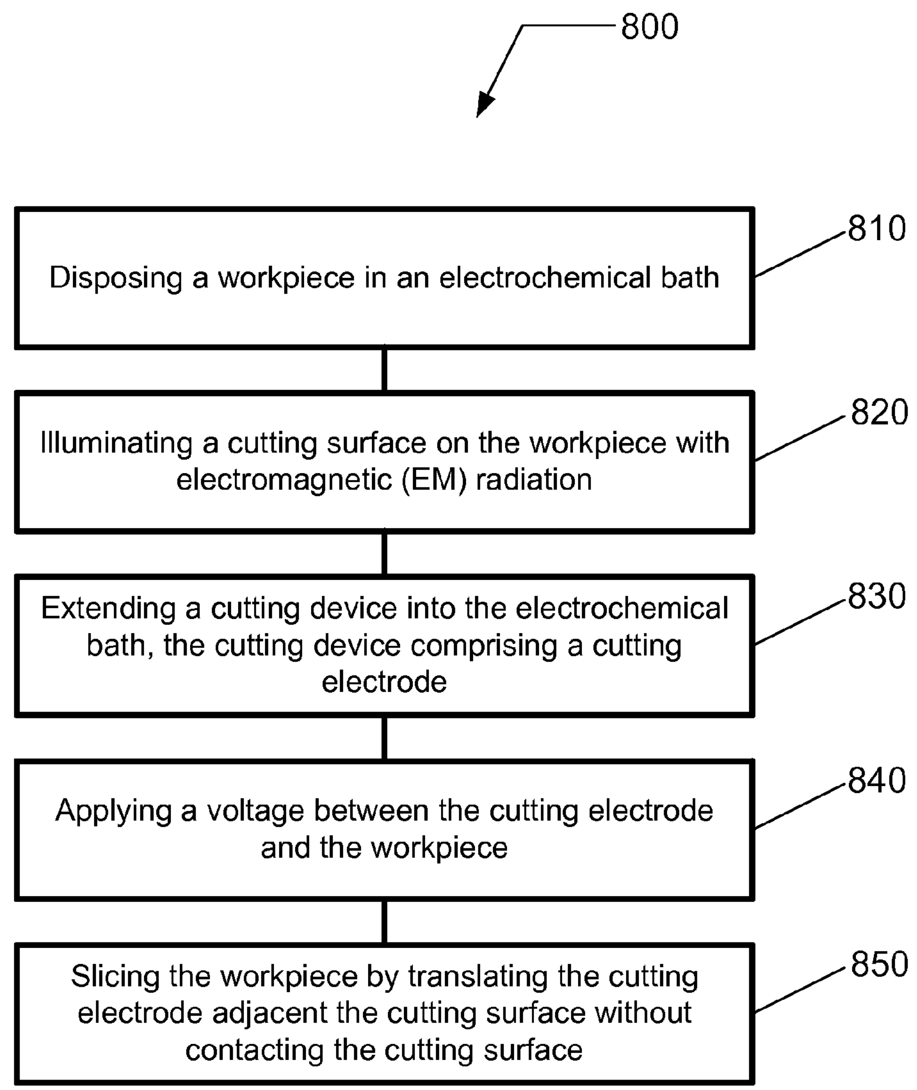
FIG. 5 illustrates a method of electrochemical slicing according to yet another embodiment.

Referring now to FIG. 5, a method of electrochemical slicing is described according to an embodiment. The method includes a flow chart 800 beginning in 810 with disposing a workpiece in an electrochemical bath.

In 820, a cutting surface on the workpiece is illuminated with electromagnetic (EM) radiation. The method may further comprise illuminating the cutting surface on the workpiece with second electromagnetic (EM) radiation different than the EM radiation.

In 830, a cutting device is extended into the electrochemical bath, wherein the cutting device comprises a cutting electrode.

In 840, a voltage is applied between the cutting electrode and the workpiece.

In 850, the workpiece is sliced by translating the cutting electrode adjacent the cutting surface without contacting the cutting surface.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

The invention claimed is:

1. An electrochemical slicing apparatus, comprising:

an electrochemical bath configured to contain an electrochemical solution;

a support apparatus configured to support and immerse a workpiece in said electrochemical bath;

a non-contact cutting device comprising a cutting electrode that is a conductive wire or conductive ribbon and an electrical power source coupled to said cutting electrode and said workpiece and configured to apply a voltage between said cutting electrode and said workpiece, wherein said cutting electrode is configured to extend into said electrochemical bath and slice said workpiece via electrochemical etching along a cutting plane to form an evolving cutting groove in said workpiece defined by a cutting surface between opposing sidewalls, and wherein said cutting electrode is configured to further extend into said evolving cutting groove between said opposing sidewalls during said slicing; and an electromagnetic (EM) radiation source configured to illuminate said cutting surface within said evolving cutting groove during slicing along said cutting plane, wherein said cutting electrode comprises one or more openings formed there through to allow greater exposure of said cutting surface to said EM radiation source.

2. The electrochemical slicing apparatus of claim 1, wherein said workpiece comprises a silicon ingot.

3. The electrochemical slicing apparatus of claim 1, wherein said electrochemical solution comprises a dilute solution of HF (hydrogen fluoride).

4. The electrochemical slicing apparatus of claim 1, wherein said EM radiation source comprises a source of ultraviolet (UV) light, visible light, or infrared (IR) light, or any combination of two or more thereof.

5. The electrochemical slicing apparatus of claim 1, wherein said EM radiation source provides EM radiation having a wavelength ranging from about 200 nm (nanometers) to about 700 nm.

6. The electrochemical slicing apparatus of claim 1, wherein said EM radiation source provides EM radiation having a wavelength ranging from about 200 nm to about 400 nm.

7. The electrochemical slicing apparatus of claim 1, wherein said cutting electrode comprises gold, platinum, tungsten, or any combination of two or more elements thereof.

8. The electrochemical slicing apparatus of claim 1, wherein said optical waveguide comprises a plurality of optical fibers, or an optical sheet, or a combination thereof.

9. The electrochemical slicing apparatus of claim 8, wherein said cutting electrode extends along a bottom edge of said optical sheet.

10. The electrochemical slicing apparatus of claim 9, wherein said cutting electrode is embedded within said bottom edge of said optical sheet.

11. The electrochemical slicing apparatus of claim 1, wherein said optical waveguide comprises a sapphire member.

12. The electrochemical slicing apparatus of claim 1, wherein said EM radiation contains a first wavelength or first range of wavelengths, and a second wavelength or second range of wavelengths different from said first wavelength or first range of wavelengths.

13. The electrochemical slicing apparatus of claim 12, wherein said first wavelength or first range of wavelengths is provided by said EM radiation source, and said second wavelength or second range of wavelengths is provided by another EM radiation source.

14. An electrochemical slicing apparatus, comprising:

an electrochemical bath configured to contain an electrochemical solution;

a support apparatus configured to support and immerse a workpiece in said electrochemical bath;

a non-contact cutting device comprising an optical waveguide, a cutting electrode extending along a bottom edge of said optical waveguide, and an electrical power source coupled to said cutting electrode and said workpiece and configured to apply a voltage between said cutting electrode and said workpiece, wherein said cutting electrode is configured to extend into said electrochemical bath and slice said workpiece via electrochemical etching along a cutting plane to form an evolving cutting groove in said workpiece defined by a cutting surface between opposing sidewalls, and wherein said cutting electrode is configured to further extend into said evolving cutting groove between said opposing sidewalls during said slicing; and an electromagnetic (EM) radiation source configured to illuminate said cutting surface within said evolving cutting groove during slicing along said cutting plane, wherein said optical waveguide is configured to direct and/or collimate EM radiation from said EM radiation source towards said cutting surface relative to said sidewalls in order to preferentially etch said cutting surface rather than said sidewalls.

15. The electrochemical slicing apparatus of claim 14, wherein said optical waveguide comprises a plurality of optical fibers, or an optical sheet, or a combination thereof.

16. The electrochemical slicing apparatus of claim 15, wherein said cutting electrode is embedded within said bottom edge of said optical sheet.

17. The electrochemical slicing apparatus of claim 16, wherein said cutting electrode is a conductive wire or conductive ribbon.

18. The electrochemical slicing apparatus of claim 14, wherein said EM radiation contains a first wavelength or first range of wavelengths provided by said EM radiation source, and a second wavelength or second range of wavelengths different from said first wavelength or first range of wavelengths provided by another EM radiation source.

19. The electrochemical slicing apparatus of claim 14, wherein said cutting electrode comprises one or more openings formed there through to allow greater exposure of said cutting surface to said EM radiation source.

* * * * *

UNITED STATES PATENT AND TRADEMARK OFFICE

CERTIFICATE OF CORRECTION

PATENT NO. : 8,444,848 B2
APPLICATION NO. : 12/697985
DATED : May 21, 2013
INVENTOR(S) : Hongyu H. Yue et al.

It is certified that error appears in the above-identified patent and that said Letters Patent is hereby corrected as shown below:

In the Claims:

In Col. 6, line 1, Claim 1, “cutting device comprising a cutting electrode” should read --cutting device comprising an optical waveguide, a cutting electrode--.

In Col. 6, line 19, Claim 1, “said EM radiation source.” should read --said EM radiation source, and wherein said optical waveguide is configured to direct and/or collimate EM radiation from said EM radiation source towards said cutting surface relative to said sidewalls in order to preferentially etch said cutting surface rather than said sidewalls.--.

Signed and Sealed this
Twenty-third Day of July, 2013

Teresa Stanek Rea
*Acting Director of the United States Patent and Trademark Office*